(12) United States Patent
Ahmed et al.

(10) Patent No.: US 6,995,438 B1
(45) Date of Patent: Feb. 7, 2006

(54) SEMICONDUCTOR DEVICE WITH FULLY SILICIDED SOURCE/DRAIN AND DAMASCENCE METAL GATE

(75) Inventors: Shibly S. Ahmed, San Jose, CA (US); Haihong Wang, Milpitas, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/674,478

(22) Filed: Oct. 1, 2003

(51) Int. Cl.
*H01L 31/062* (2006.01)
*H01L 31/113* (2006.01)
*H01L 31/119* (2006.01)

(52) U.S. Cl. .................. 257/396; 257/301; 257/329; 257/397; 438/279; 438/301

(58) Field of Classification Search ............... 257/329, 257/307, 396, 397; 438/275, 276, 279, 289, 438/301
See application file for complete search history.

(56) References Cited

U.S. PATENT DOCUMENTS 6,699,758 B2 * 3/2004 Hirano et al. .............. 438/275
6,764,884 B1 * 7/2004 Yu et al. .................... 438/157

OTHER PUBLICATIONS

Digh Hisamoto et al., "FinFET-A Self-Aligned Double-Gate MOSFET Scalable to 20 nm," IEEE Transactions on Electron Devices, vol. 47, No. 12, Dec. 2000, pp. 2320-2325.
Yang-Kyu Choi et al., "Sub-20nm CMOS FinFET Technologies," 2001 IEEE, IEDM, pp. 421-424.
Xuejue Huang et al., "Sub-50 nm P-Channel FinFET," IEEE Transactions on Electron Devices, vol. 48, No. 5, May 2001, pp. 880-886.
Xuejue Huang et al., "Sub 50-nm FinFET: PMOS," 1999 IEEE, IEDM, pp. 67-70.
Yang-Kyu Choi et al., "Nanoscale CMOS Spacer FinFET for the Terabit Era," IEEE Electron Device Letters, vol. 23, No. 1, Jan. 2002, pp. 25-27.

* cited by examiner

*Primary Examiner*—David Nelms
*Assistant Examiner*—Renee R. Berry
(74) *Attorney, Agent, or Firm*—Harrity & Snyder, LLP

(57) ABSTRACT

A semiconductor device includes a substrate and an insulating layer formed on the substrate. A conductive fin may be formed on the insulating layer. Fully silicided source and drain regions may be formed adjacent to the fin. A metal gate may be formed over a portion of the fin via a damascene process.

11 Claims, 10 Drawing Sheets

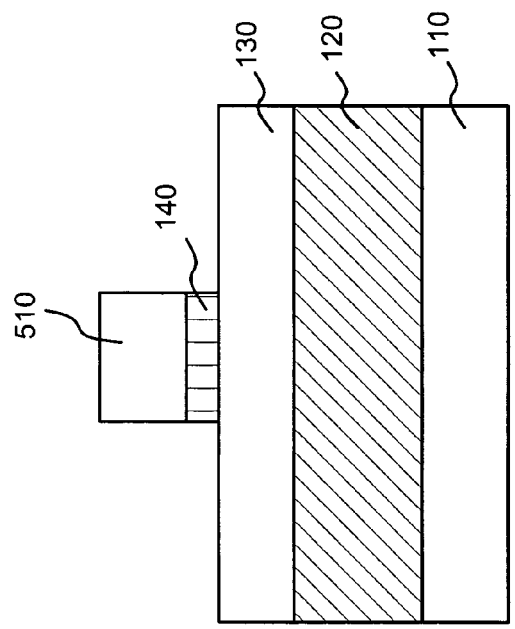
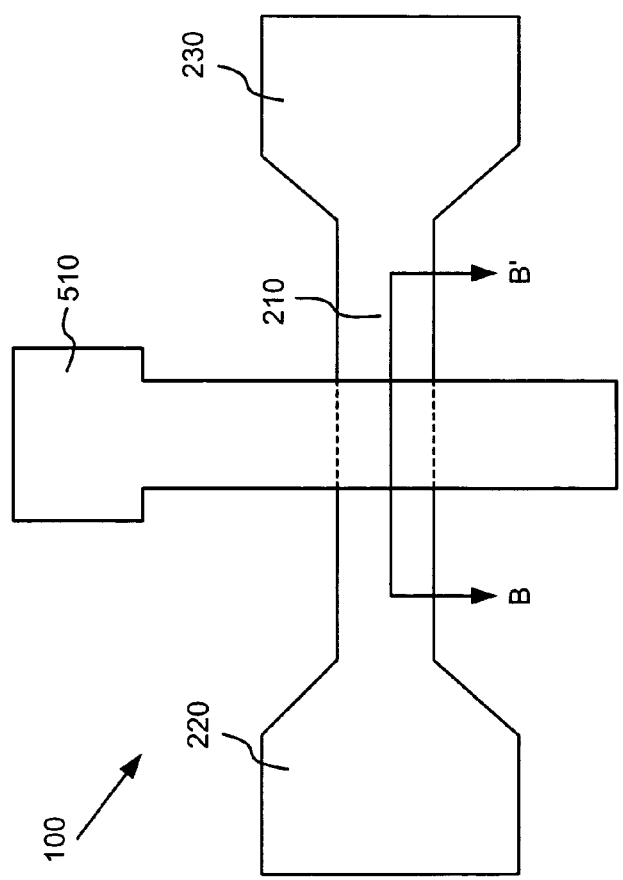
Fig. 5B
Fig. 5A

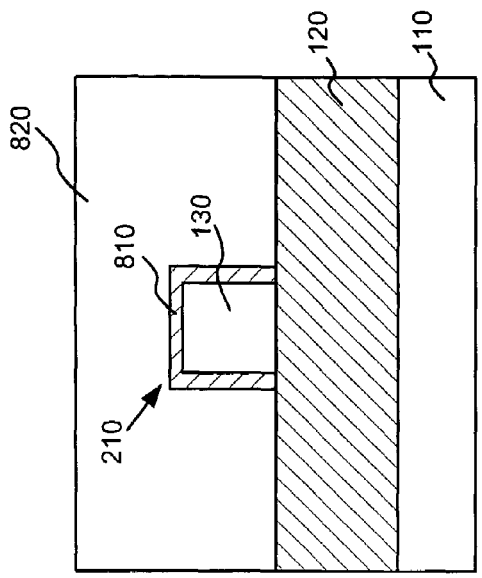
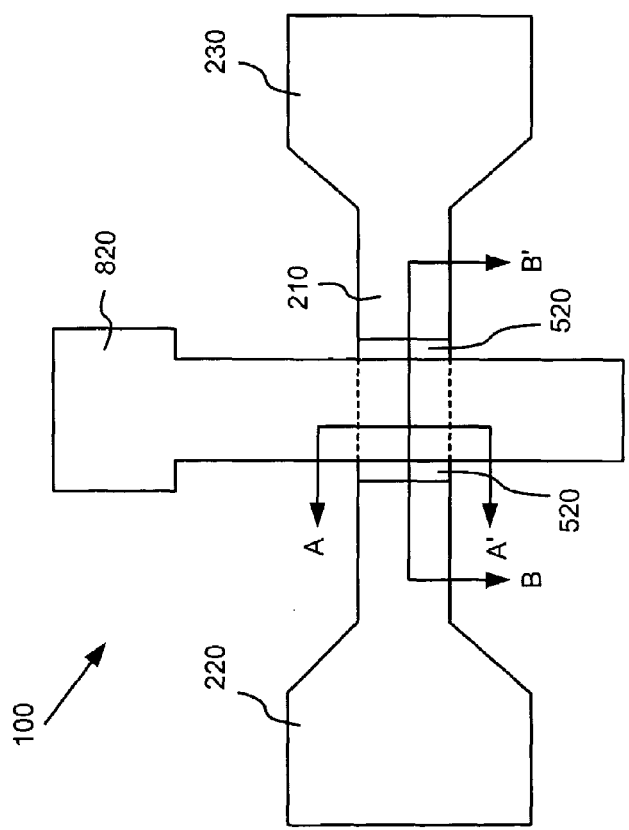
Fig. 8B
Fig. 8A

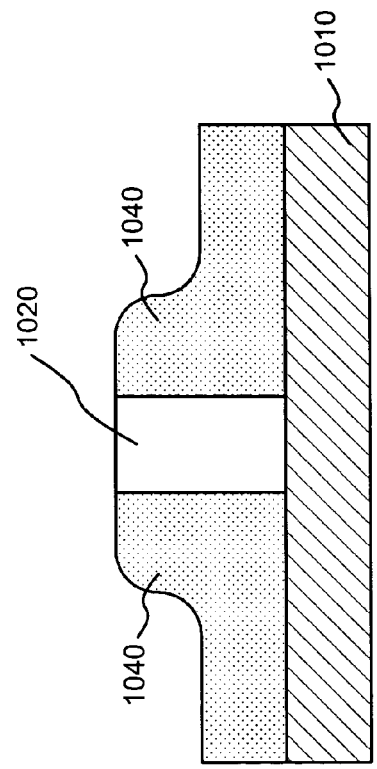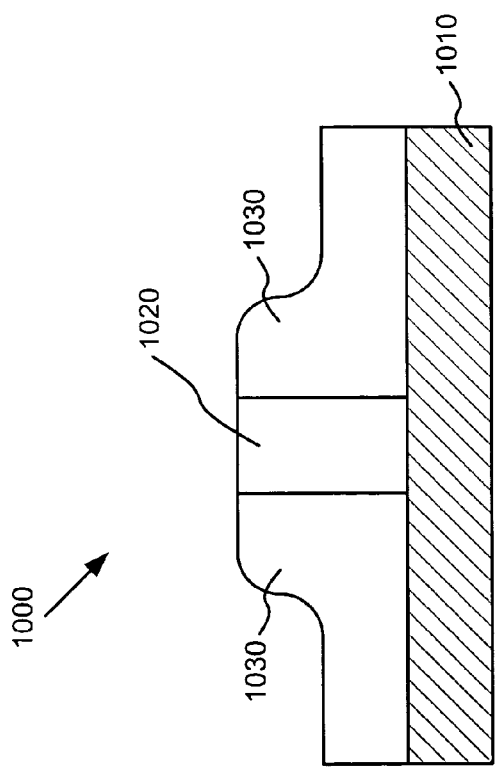
Fig. 10B
Fig. 10A

SEMICONDUCTOR DEVICE WITH FULLY SILICIDED SOURCE/DRAIN AND DAMASCENCE METAL GATE

TECHNICAL FIELD

The present invention relates to semiconductor devices and methods of manufacturing semiconductor devices. The present invention has particular applicability to double-gate devices.

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In several respects, the double-gate MOSFETs offer better characteristics than the conventional bulk silicon MOSFETs. These improvements arise because the double-gate MOSFET has a gate electrode on both sides of the channel, rather than on only one side as in conventional MOSFETs. When there are two gates, the electric field generated by the drain is better screened from the source end of the channel. Also, two gates can control roughly twice as much current as a single gate, resulting in a stronger switching signal.

A FinFET is a recent double-gate structure that exhibits good short channel behavior. A FinFET includes a channel formed in a vertical fin. The FinFET structure may be fabricated using layout and process techniques similar to those used for conventional planar MOSFETs.

DISCLOSURE OF THE INVENTION

Implementations consistent with the present invention may provide a FinFET device with a metal gate and silicided source and drain regions. The metal gates may reduce gate resistance, and the silicided source and drain regions may reduce resistance of the FinFET device.

Additional advantages and other features of the invention will be set forth in part in the description which follows and in part will become apparent to those having ordinary skill in the art upon examination of the following or may be learned from practice of the invention. The advantages and features of the invention may be realized and obtained as particularly pointed out in the appended claims.

According to the present invention, the foregoing and other advantages are achieved in part by a semiconductor device that includes a substrate and an insulating layer formed on the substrate. A fin may be formed on the insulating layer. Silicided source and drain regions may be formed adjacent the fin. A metal gate may be formed over a portion of the fin.

According to another aspect of the invention, a method of manufacturing a semiconductor device may include forming a fin structure on an insulator and forming source and drain portions. A gate structure may be formed over a channel portion of the fin structure. The method also may include forming a dielectric layer adjacent the gate structure and removing material in the gate structure to define a gate recess in the dielectric layer. A metal gate may be formed in the gate recess. The source and drain regions may be silicided.

According to a further aspect of the invention, a semiconductor device may include a substrate and an insulating layer formed on the substrate. A fin may be formed on the insulating layer, and a dielectric layer may be formed on the fin. A metal gate may be formed over a portion of the fin and the dielectric layer. A pair of spacers may be formed on the fin on opposite sides of the metal gate. Silicided source and drain regions may be formed on the opposite sides of the metal gate.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, where elements having the same reference number designation may represent like elements throughout.

FIG. 5A schematically illustrates a top view of a FinFET structure in accordance with an exemplary embodiment of the present invention.

FIGS. 5B and 5C are cross-sections illustrating the formation of the FinFET structure of FIG. 5A in accordance with an exemplary embodiment of the present invention.

FIG. 8A schematically illustrates the top view of the FinFET structure in accordance with an exemplary embodiment of the present invention.

FIGS. 8B and 8C are cross-sections further illustrating the formation of the FinFET structure in accordance with an exemplary embodiment of the present invention.

FIGS. 10A and 10B are cross-sections illustrating the formation of a contact structure in a semiconductor device in accordance with another implementation of the present invention.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide FinFET devices and methods of manufacturing such devices. The gates in the FinFET devices formed in accordance with the present invention may include a metal. Source and drain regions may be fully silicided.

Figure 1:
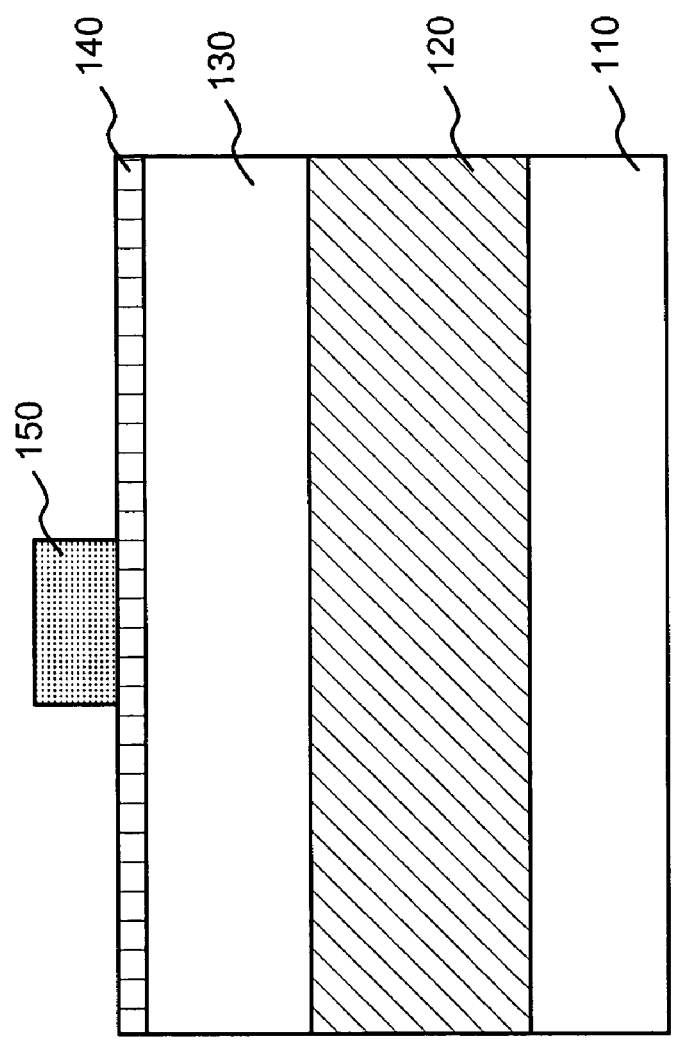
FIG. 1 is a cross-section illustrating exemplary layers that may be used for forming a fin in accordance with an embodiment of the present invention.

FIG. 1 illustrates the cross-section of a semiconductor device 100 formed in accordance with an embodiment of the present invention. Referring to FIG. 1, semiconductor device 100 may include a silicon on insulator (SOI) structure that includes a silicon substrate 110, a buried oxide layer 120 and a silicon layer 130 formed on the buried oxide layer 120. Buried oxide layer 120 and silicon layer 130 may be formed on substrate 110 in a conventional manner.

In an exemplary implementation, buried oxide layer 120 may include a silicon oxide and may have a thickness ranging from about 1000 Å to about 3000 Å. Silicon layer 130 may include monocrystalline or polycrystalline silicon having a thickness ranging from about 300 Å to about 1500 Å. Silicon layer 130 is used to form a fin structure for a double-gate transistor device, as described in more detail below.

In alternative implementations consistent with the present invention, substrate 110 and layer 130 may include other semiconducting materials, such as germanium, or combinations of semiconducting materials, such as silicon-germanium. Buried oxide layer 120 may also include other dielectric materials.

A top dielectric layer 140, such as a silicon nitride layer or a silicon oxide layer (e.g., SiO$_2$), may be formed over silicon layer 130 to act as a protective cap during subsequent etching processes. In an exemplary implementation, dielectric layer 140 may be formed to a thickness ranging from about 150 Å to about 700 Å. Next, a photoresist material may be deposited and patterned to form a photoresist mask 150 for subsequent processing. The photoresist material may be deposited and patterned in any conventional manner.

Semiconductor device 100 may then be etched. In an exemplary implementation, dielectric layer 140 and silicon layer 130 may be etched in a conventional manner, with the etching terminating on buried oxide layer 120 to form a fin. Photoresist mask 150 may then be removed. After the formation of the fin, source and drain regions may be formed (e.g., by deposition or epitaxial growth of a semiconducting material) adjacent the respective ends of the fin. For example, in an exemplary embodiment, a layer of silicon, germanium or combination of silicon and germanium may be deposited, patterned and etched in a conventional manner to form source and drain regions. Alternately, the source and drain regions may be formed in the same photolithography process that forms the fin.

Figure 2A:
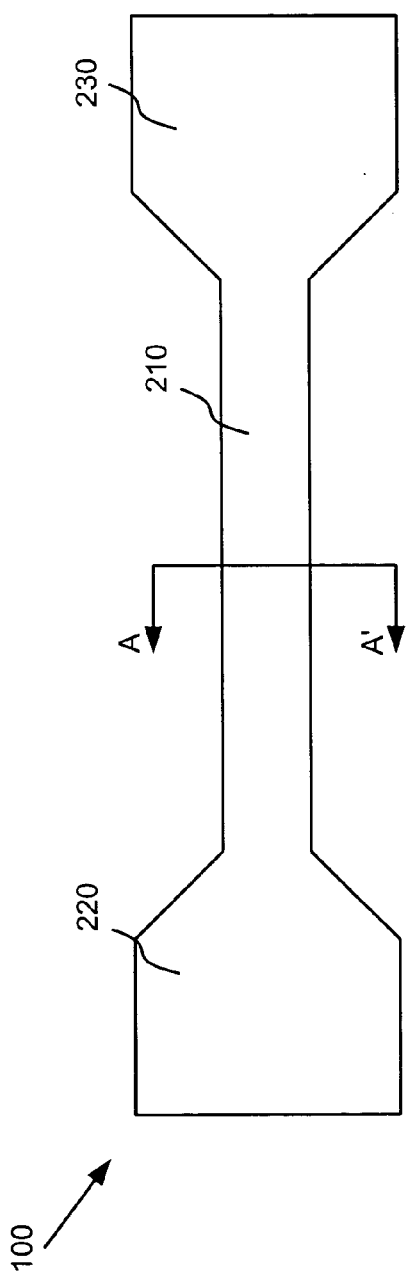
FIG. 2A schematically illustrates the top view of a fin structure in accordance with an exemplary embodiment of the present invention.

FIG. 2A schematically illustrates the top view of a fin structure on semiconductor 100 formed in such a manner. Source region 220 and drain region 230 may be formed adjacent the ends of fin 210 on buried oxide layer 120, according to an exemplary embodiment of the present invention.

Figure 2B:
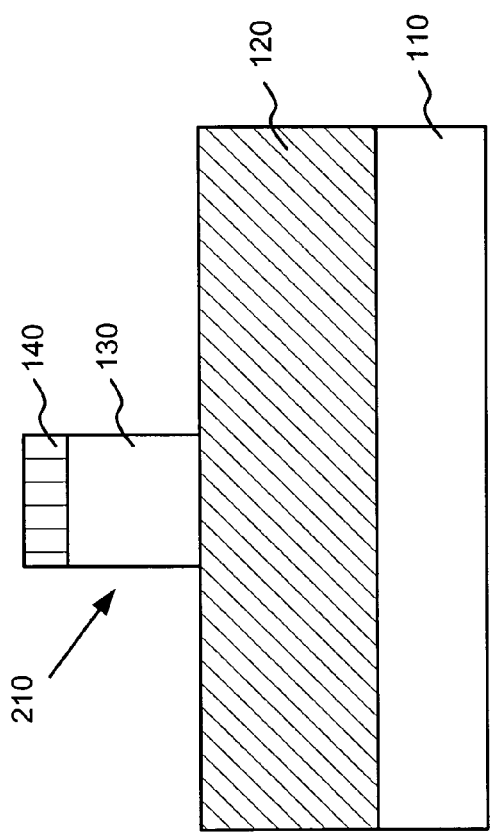
FIG. 2B is a cross-section illustrating the formation of the fin structure of FIG. 2A in accordance with an exemplary embodiment of the present invention.

FIG. 2B is a cross-section along line A–A' in FIG. 2A illustrating the formation of fin structure 210 in accordance with an exemplary embodiment of the present invention. As described above, dielectric layer 140 and silicon layer 130 may be etched to form structure 210. Structure 210 may include a silicon fin 130 and dielectric cap 140. In an exemplary implementation, the width of silicon fin 130 may range from about 100 Å to about 1000 Å.

Figure 3:
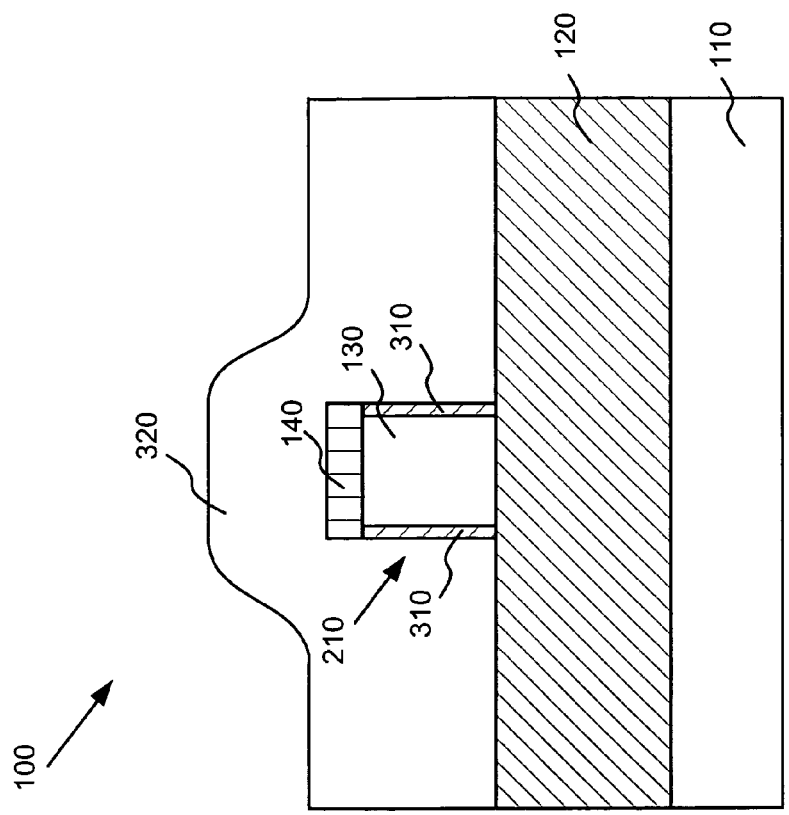
FIG. 3 is a cross-section illustrating the formation of a gate oxide and gate material on the device of FIG. 2B in accordance with an exemplary embodiment of the present invention.

FIG. 3 is a cross-section illustrating the formation of a gate oxide and gate material on fin structure 210 in accordance with an exemplary embodiment of the present invention. A relatively thin gate oxide may be formed on exposed side surfaces of fin 130 as illustrated in FIG. 3. For example, a gate oxide 310 may be thermally grown on fin 130. Gate oxide 310 may be grown to a thickness of about 10 Å to about 100 Å and may be formed on the side surfaces of fin 130.

A gate material layer 320 may be deposited over semiconductor device 100 after formation of gate oxide 310. In an exemplary implementation, gate material layer 320 may include polysilicon deposited using conventional chemical vapor deposition (CVD) or other well known techniques. Alternatively, other semiconducting materials, such as germanium or combinations of silicon and germanium, or various metals may be used as the gate material in layer 320.

Figure 4:
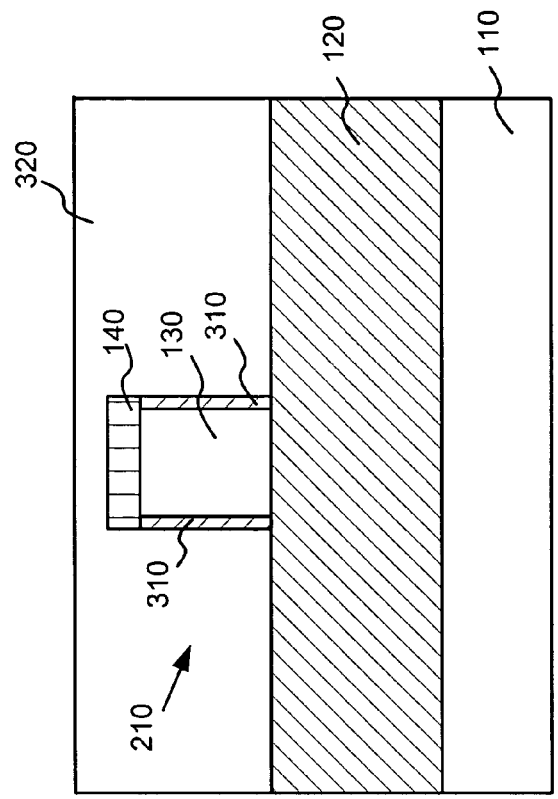
FIG. 4 is a cross-section illustrating the planarizing of the gate material of FIG. 3 in accordance with an exemplary embodiment of the present invention.

FIG. 4 is a cross-section illustrating the planarizing of gate material 320 in accordance with an exemplary embodiment of the present invention. Planarizing gate material 320 may remove any non-planar protrusions in the material, such as that shown above the fin structure 210 in FIG. 3. Returning to FIG. 4, chemical-mechanical polishing (CMP) or other conventional techniques may be performed so that the upper surface of gate material 320 is substantially planar. Planar gate material 320 may extend about 200 Å to about 700 Å above dielectric cap 140. A thickness of gate material 320 in the areas adjacent fin structure 210 after planarizing may range from 800 Å to 3000 Å.

FIG. 5A schematically illustrates the top view of semiconductor device 100 at one stage in processing in accordance with an exemplary embodiment of the present invention. As illustrated, a gate may be patterned and etched in gate material 320 to form gate structure 510 that extends across a channel region of the fin structure 210.

FIG. 5B is a cross-section taken along line B–B' in FIG. 5A and illustrates the formation of semiconductor device 100 of FIG. 5A in accordance with an exemplary embodiment of the present invention. Gate structure 510 may be defined in gate material layer 320 by lithography (e.g., photolithography). A bottom antireflective coating (BARC)

layer (not shown) may be deposited on planar gate material layer 320 to facilitate etching of gate material layer 320. As will be understood by those skilled in the semiconductor art, photoresist (and possibly a top antireflective (TAR) coating) may be deposited on the BARC layer and patterned in the shape of gate structure 510.

Gate material layer 320 may then be selectively etched to form gate structure 510 out of gate material layer 320 on device 100. Planar gate material layer 320 may provide at least a planar bottom surface for the BARC layer (not shown), and may tend to flatten the top surface of the BARC layer. The BARC layer may have a thickness ranging from about 100 Å to about 500 Å. Because of planar gate material layer 320, the photoresist over the BARC layer may be patterned more precisely. As a result, the gate structure 510's critical dimension (CD) (i.e., its smallest feature size, such as the gate width) may be formed with dimensions as small as from about 20 nm to about 50 nm.

Gate structure 510 may include a gate portion proximate to the sides of the fin structure 210 and a larger electrode portion spaced apart from the fin structure 210. The electrode portion of gate structure 510 may provide an accessible electrical contact for biasing or otherwise controlling the gate portion.

As may be seen in FIG. 5B, dielectric cap 140 located outside the perimeter of the gate structure 510 may be removed. In other words, the selective etching of gate material layer 320 may remove all material beyond gate structure 510, down to fin 130 of fin structure 210. Further, it should be noted that gate oxide 310 is still present on fin 130, but is not illustrated in FIG. 5B because the line B–B' in FIG. 5A extends along fin 130 of fin structure 210.

Figure 5C:
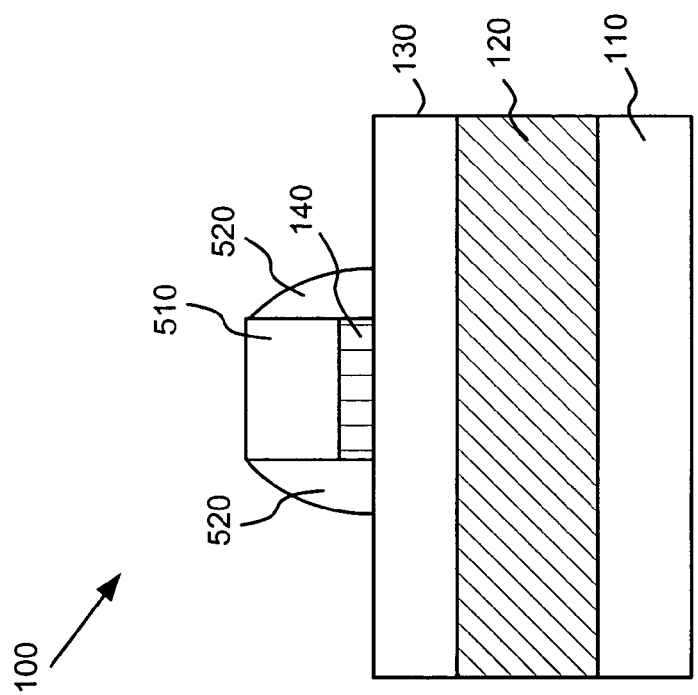

FIG. 5C is a cross-section taken along line B–B' in FIG. 5A and illustrates a further stage in the formation of the semiconductor device of FIG. 5B. A spacer material may be deposited adjacent gate structure and etched to form sidewall spacers 520. In one implementation, the spacer material may include a nitride material, such as $Si_3N_4$. Sidewall spacers 520 may be formed prior to source/drain ion implantation to control the location of the source/drain junctions based on the particular circuit requirements.

The source/drain regions 220 and 230 may then be doped. For example, n-type or p-type impurities may be implanted in source/drain regions 220 and 230. The particular implantation dosages and energies may be selected based on the particular end device requirements. One of ordinary skill in this art would be able to optimize the source/drain implantation process based on the circuit requirements and such acts are not disclosed herein in order not to unduly obscure the thrust of the present invention. Activation annealing may then be performed to activate the source/drain regions 220 and 230.

Figure 6A:
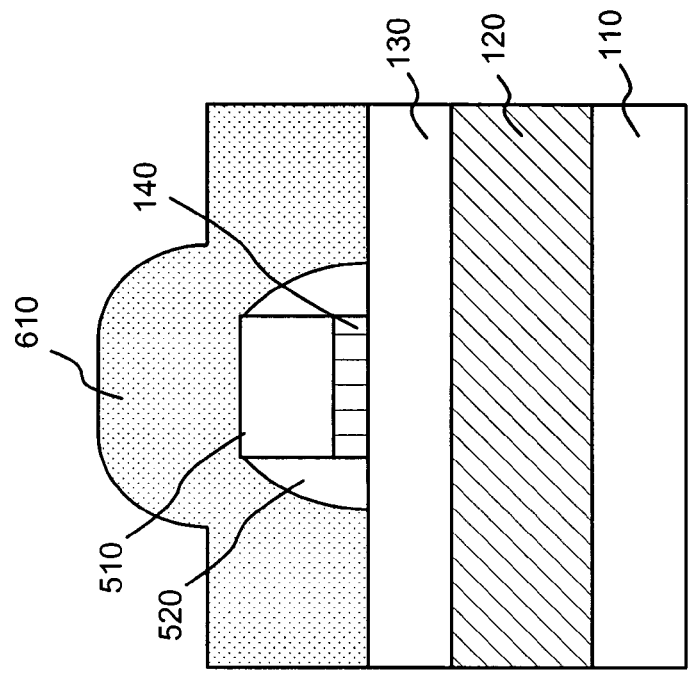
FIG. 6A is a cross-section illustrating the formation of a surrounding oxide layer on the FinFET structure of FIG. 5C in accordance with an exemplary embodiment of the present invention.

FIG. 6A is a cross-section illustrating the formation of a surrounding dielectric layer 610 on semiconductor device 100 of FIG. 5B in accordance with an exemplary embodiment of the present invention. As illustrated, surrounding dielectric layer 610 may be deposited over fin structure 210 (including silicon fin 130) and adjacent gate structure 510 and spacers 520. In one implementation consistent with the principles of the invention, surrounding dielectric layer 610 may include a dielectric material such as tetraethyl orthosilicate (TEOS), although any other dielectric material may be used.

Figure 6C:
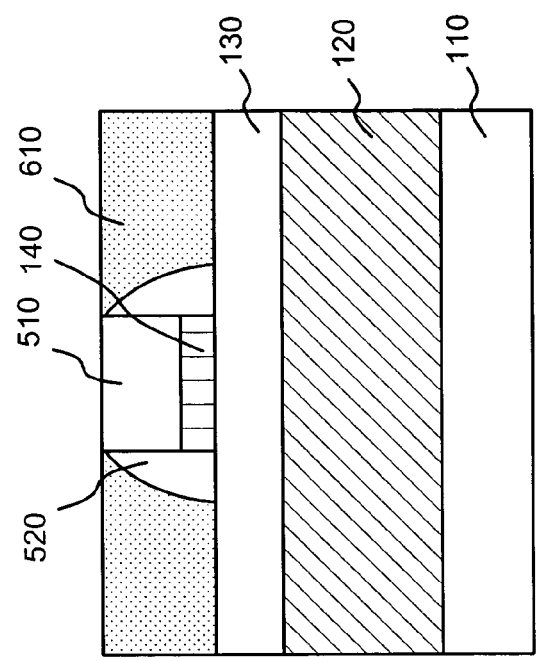
FIG. 6C is a cross-section illustrating the formation of the planarized structure of FIG. 6B in accordance with an exemplary embodiment of the present invention.
Figure 6B:
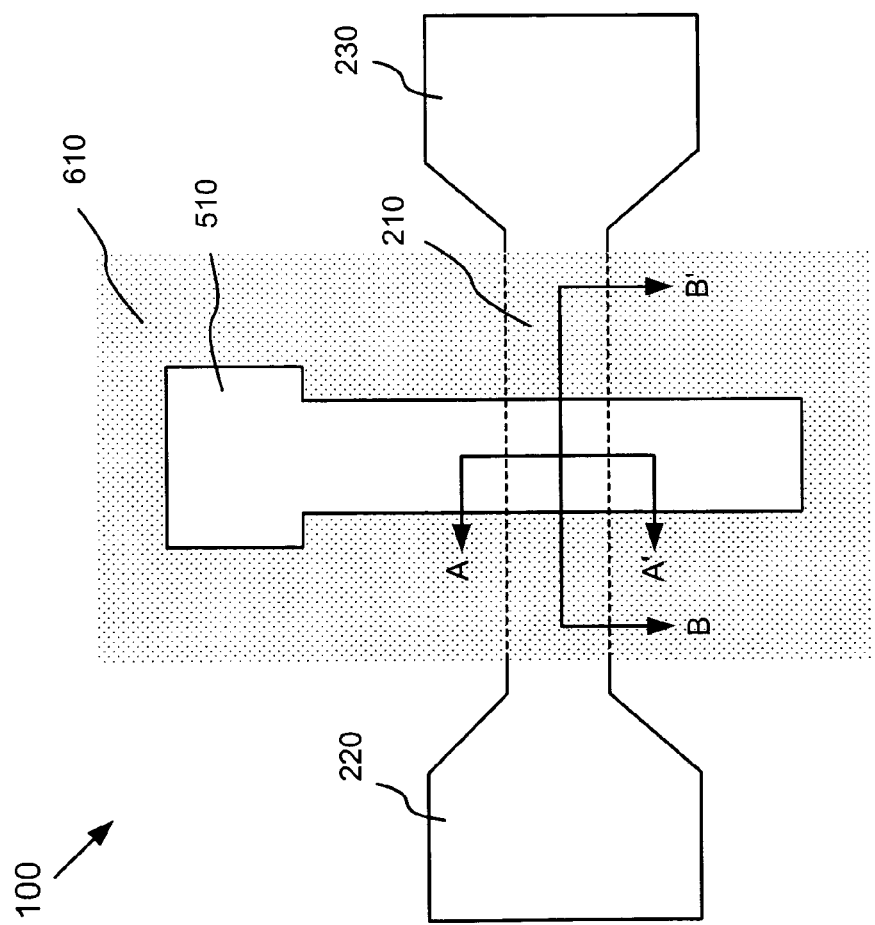
FIG. 6B schematically illustrates a top view of a planarized structure in accordance with an exemplary embodiment of the present invention.

FIG. 6B illustrates a top view of a planarized semiconductor device 100 in accordance with an exemplary embodiment of the present invention. As shown, surrounding dielectric layer 610 may be removed from over gate structure 510, for example, by a polishing process. Surrounding dielectric layer 610, however, may still surround spacers 520 and the perimeter of gate structure 510. Although not illustrated in FIG. 6B, surrounding dielectric layer 610 also may extend over source/drain regions 220 and 230 in some implementations.

FIG. 6C is a cross-section along line B–B' in FIG. 6B illustrating the formation of planarized semiconductor device 100 in accordance with an exemplary embodiment of the present invention. As shown, surrounding dielectric layer 610 may be polished back (e.g., by CMP) to expose gate structure 510 and to be coplanar with the top of gate structure 510. As illustrated in FIG. 6C, surrounding dielectric layer 610 may extend above the entire silicon fin 130 except for the portion of silicon fin 130 that is covered by the dielectric cap 140 and gate structure 510.

Figure 7:
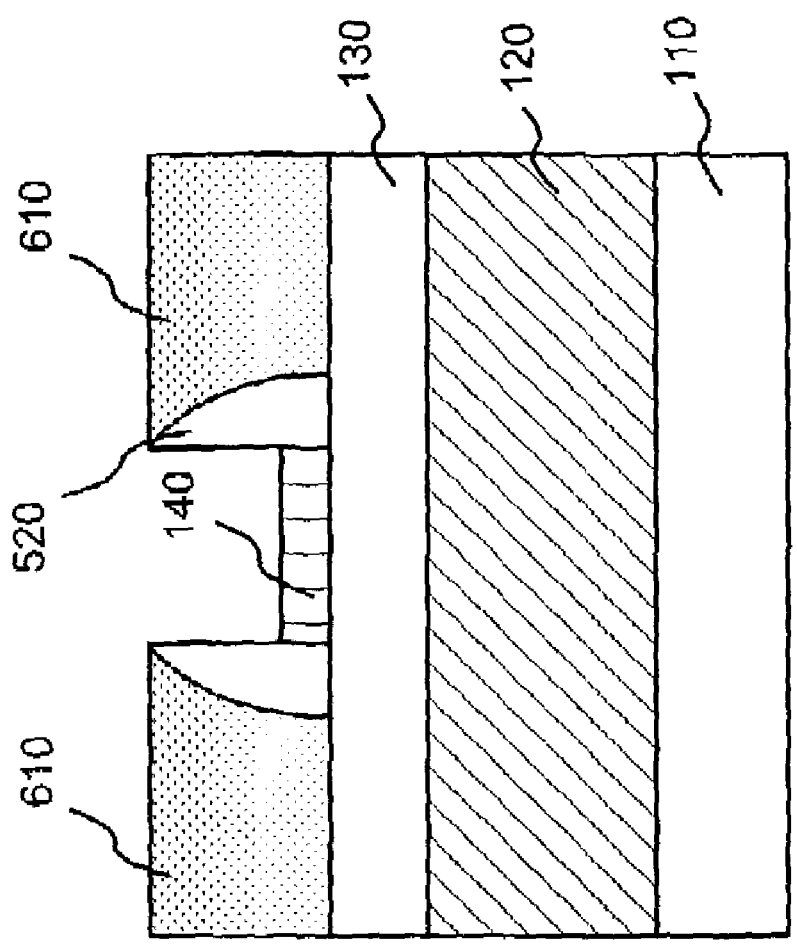
FIG. 7 is a cross-section illustrating a further stage in the formation of the FinFET structure in accordance with an exemplary embodiment of the present invention.

FIG. 7 is a cross-section along line B–B' in FIG. 6B illustrating a further stage in the formation of the semiconductor device 100 in accordance with an exemplary embodiment of the present invention. As shown, gate structure 510 (e.g., polysilicon) may be removed by, for example, selective etching to create an opening or gate recess area. Although not explicitly shown, gate oxide 310 may also be removed from the sides of fin 130 in the proximity of gate structure 510 during this selective etching. Because gate structure 510 is intended to be removed during processing, it may be referred to as a "dummy gate." Dielectric cap 140 under the gate structure 510 may protect the top of fin 130 from being etched during the removal of gate structure 510. Dielectric layer 610 may act as a mask to protect other portions of semiconductor device 100 during the etching.

As shown in FIG. 7, at least some of dielectric cap 140 may remain after removing gate structure 510. In one implementation consistent with the principles of the invention, dielectric cap 140 (and possibly gate oxide 310) may be left in place to insulate fin 130 from subsequently-deposited gate material (e.g., a metal). In another implementation consistent with the principles of the invention (described further below), dielectric cap 140 may be removed (e.g., by etching) so that fin 130 in the channel region of semiconductor device 100 is exposed for subsequent processing.

FIG. 8A schematically illustrates the top view of semiconductor device 100 in accordance with an exemplary embodiment of the present invention. The dotted lines in FIG. 8A illustrate fin 130 in the channel region of fin structure 210. FIG. 8B is a cross-section along line A–A' in FIG. 8A further illustrating the formation of semiconductor device 100.

Figure 8C:
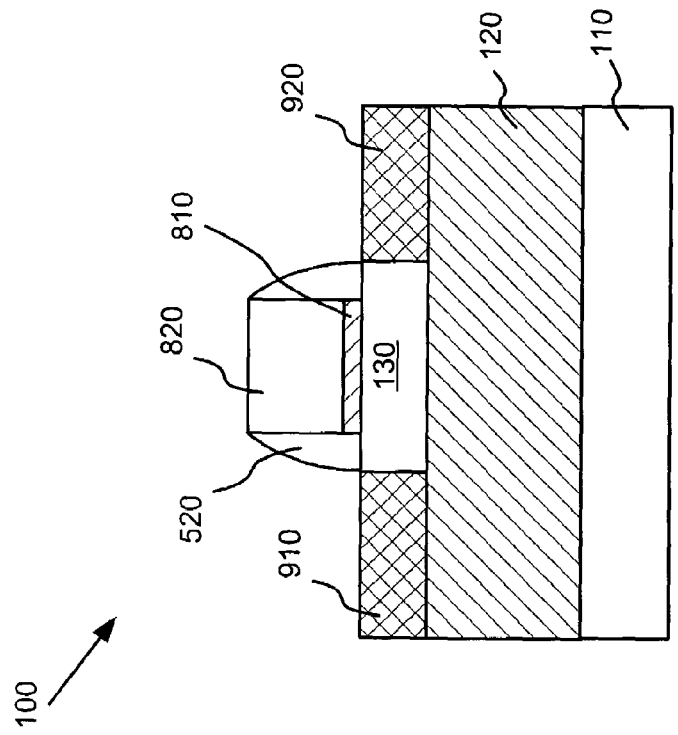

FIG. 8C is a cross-section along line B–B' in FIG. 8A further illustrating the formation of semiconductor device 100.

A high-k dielectric material 810 such as $HfO_2$ or HfSiO may be formed on fin 130 in the channel region as illustrated in FIG. 8B. Such a high-k dielectric material 810 may have a dielectric constant k higher than about 3.9. In another implementation consistent with the principles of the invention, dielectric material 810 may be an oxide (e.g., $SiO_2$) that is thermally grown on the side surfaces of fin 130 (and the top surface if dielectric cap 140 has been removed). The dielectric constant k of such $SiO_2$ material may be about 3.9. In either case, the dielectric material 810 may serve as the gate dielectric layer for semiconductor device 100 in the implementation illustrated in FIGS. 8A and 8B.

Next, a metal, such as tantalum nitride (e.g., TaN) or titanium nitride (e.g., TiN) may be deposited into the gate-shaped space (which may be referred to as the "gate recess") within surrounding dielectric layer 610 that was left by the removal of gate structure 510 (see FIGS. 6B and 7). This metal may form gate 820 (FIG. 8A), and may be polished (e.g., by CMP) to obtain a relatively planar top surface as shown in FIG. 8C. The surrounding dielectric layer 610 around gate 820 may then be removed. FIG. 8A illustrates FinFET device 100, including spacers 520 adjacent gate 820, after removal of dielectric layer 610. Other metals than tantalum and titanium may be used to form gate 820.

Figure 9:
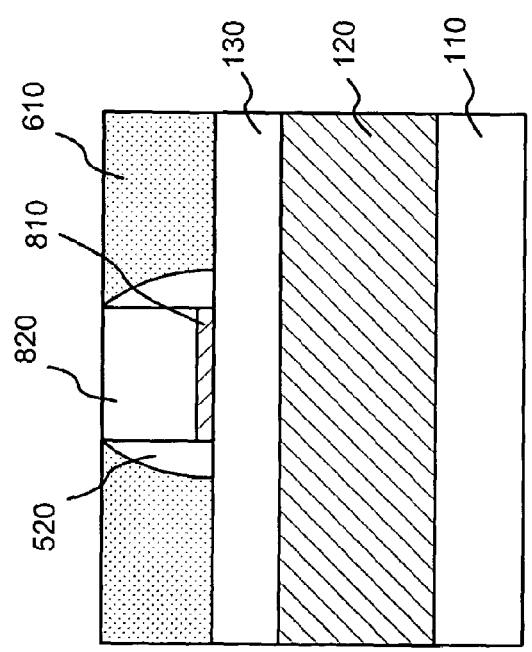
FIG. 9 is a cross-section further illustrating the formation of the FinFET structure in accordance with an exemplary embodiment of the present invention.

FIG. 9 is a cross-section along line B–B' in FIG. 8A further illustrating the formation of semiconductor device 100 after removal of surrounding dielectric layer 610. Source/drain regions 220/230 may be "fully silicided" (i.e., silicided down to buried oxide layer 120) to form silicided source/drain regions 910/920. Alternately, or additionally, some portions of fin 130 may be fully silicided. The channel portion of fin 130 under spacers 520 and gate 820 may not be silicided, as shown in FIG. 9.

For such siliciding, a metal (e.g., nickel or cobalt) may be deposited over source and drain regions 220/230 (i.e., those regions adjacent (and/or part of) fin 130 not covered by gate 820 and spacers 520). The metal may then be annealed to form fully silicided source and drain regions 910/920 (e.g., producing NiSi or $CoSi_2$) as illustrated in FIG. 9, thereby reducing series resistance of device 100. In an exemplary implementation, the thickness of the fully silicided source/drain regions 910/920 may range from about 400 Å to about 1500 Å.

Thus, in accordance with the present invention, a FinFET device 100 may be formed with metal gate 820 and fully silicided source/drain regions 910/920. Metal gate 820 may be formed via a damascene process by removing dummy gate 510. Advantageously, the resulting structure exhibits good short channel behavior. Metal gate 820 may also reduce gate resistance and eliminates poly depletion problems associated with polysilicon gates. Fully silicided source/drain regions 910/920 may reduce series resistance in device 100. In addition, the present invention provides increased flexibility and can be easily integrated into conventional processing.

Other Implementation

In some implementations, it may be desirable to save area when forming a contact for a fin. FIGS. 10A and 10B are cross-sections illustrating the formation of a contact structure in a semiconductor device in accordance with another implementation of the present invention. FIG. 10A is a cross-section illustrating a FinFET 1000 after fin formation (similar to FIG. 2B). A silicon fin 1020 may be formed on an insulator 1010 (and a substrate, not shown). A contact material layer 1030 (e.g., polysilicon) may be deposited adjacent one or both sides of fin 1020, as shown in FIG. 10A. In one implementation, contact material layer 1030 may also extend over the top of fin 1020. Such contact material may be deposited/patterned only on those portions of fin 1020 where an electrical contact is desired.

Contact material 1030 may be partially or fully silicided to form contacts 1040, as shown in FIG. 10lB. For such siliciding, a metal (e.g., nickel or cobalt) may be deposited over contact material layer 1030. Then the metal may be annealed to fully silicide contact material layer 1030 (e.g., producing contacts 1040 of NiSi or $CoSi_2$) as illustrated in FIG. 10B. In this manner, one or both of silicided contacts 1040 may electrically connect fin 1020 to another circuit element, thereby saving area in FinFET device 1000.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) can be employed.

The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the claims and their equivalents.

What is claimed is:

1. A semiconductor device, comprising:
   a substrate;
   an insulating layer formed on the substrate;
   a fin formed on the insulating layer;
   silicided source and drain regions formed adjacent the fin, wherein the silicided source and drain regions are silicided down to the insulating layer; and
   a metal gate formed over a portion of the fin.

2. The semiconductor device of claim 1 wherein fin includes silicon.

3. The semiconductor device of claim 1, wherein the metal gate includes tantalum or titanium.

4. The semiconductor device of claim 1, further comprising:
   at least one dielectric layer formed between the fin and the metal gate.

5. The semiconductor device of claim 1, wherein the silicided source and drain regions have a thickness ranging from about 400 Å to about 1500 Å.

6. The semiconductor device of claim 1, further comprising:
   a pair of spacers formed over portions of the fin and on opposite sides of the metal gate.

7. The semiconductor device of claim 6, wherein the portions of the fin under the pair of spacers separate a channel region of the fin from the silicided source and drain regions.

8. A semiconductor device, comprising:
   a substrate;
   an insulating layer formed on the substrate;
   a fin formed on the insulating layer;

a dielectric layer formed on the fin;

a metal gate formed over a portion of the fin and the dielectric layer;

a pair of spacers formed on the fin on opposite sides of the metal gate; and silicided source and drain regions having a thickness ranging from about 400 Å to about 1500 Å formed on the opposite sides of the metal gate.

9. The semiconductor device of claim 8, wherein the metal gate includes tantalum or titanium.

10. The semiconductor device of claim 8, wherein the silicided source and drain regions are composed of silicide down to the insulating layer.

11. The semiconductor device of claim 8, wherein the metal gate and the pair of spacers are located over a channel region of the fin, and wherein the silicided source and drain regions comprise a silicide material down to the insulating layer.

* * * * *